United States Patent [19]

Noguchi et al.

[11] Patent Number: 5,318,919
[45] Date of Patent: Jun. 7, 1994

[54] MANUFACTURING METHOD OF THIN FILM TRANSISTOR

[75] Inventors: Shigeru Noguchi, Hirakata; Satoshi Ishida; Hiroshi Iwata, both of Neyagawa; Keiichi Sano, Takatsuki, all of Japan

[73] Assignee: Sanyo Electric Co., Ltd., Moriguchi, Japan

[21] Appl. No.: 738,201

[22] Filed: Jul. 30, 1991

[30] Foreign Application Priority Data

| Jul. 31, 1990 [JP] | Japan | 2-203365 |
| Jul. 31, 1990 [JP] | Japan | 2-203366 |
| Aug. 23, 1990 [JP] | Japan | 2-223666 |
| Sep. 10, 1990 [JP] | Japan | 2-240360 |

[51] Int. Cl.$^5$ ................ H01L 29/04; H01L 29/784
[52] U.S. Cl. ..................... 437/41; 437/101; 437/233; 257/66; 257/72
[58] Field of Search ............ 437/21, 40, 41, 101, 437/233, 247

[56] References Cited

U.S. PATENT DOCUMENTS

| 4,317,686 | 3/1982 | Anand et al. | 437/21 |
| 4,463,492 | 8/1984 | Maeguchi | 437/21 |
| 4,753,895 | 6/1988 | Mayer et al. | 437/21 |
| 4,775,641 | 10/1988 | Duffy et al. | 437/21 |
| 4,904,611 | 2/1990 | Chiang et al. | 437/21 |
| 4,954,454 | 9/1990 | Kobushi et al. | 437/21 |
| 5,102,813 | 4/1992 | Kobayashi et al. | 437/101 |

FOREIGN PATENT DOCUMENTS

| 0390607 | 10/1990 | European Pat. Off. | 437/101 |
| 63-46777 | 2/1988 | Japan | 437/21 |
| 63-137411 | 6/1988 | Japan | 437/101 |
| 63-185015 | 7/1988 | Japan . | |
| 2-54538 | 2/1990 | Japan | 437/101 |
| 2-72614 | 3/1990 | Japan | 437/101 |
| 2-103925 | 4/1990 | Japan | 437/21 |
| 2-219240 | 8/1990 | Japan | 437/21 |
| 2-262333 | 10/1990 | Japan | 437/101 |
| 3-218640 | 9/1991 | Japan | 437/101 |
| 8402034 | 5/1984 | World Int. Prop. O. | 437/21 |

OTHER PUBLICATIONS

Low Temperature Polysilicon TET with Two-Layer Gate Insulator Using Photo-GVD and APCVD SiO$_2$, IEEE Electron Device Letters vol. 9, No. 6, Jun. 1988.
Japan J. Appl. Phys. vol. 21, No. 6, Jun., 1982, pp. L381–L383.

Primary Examiner—Mary Wilczewski
Attorney, Agent, or Firm—Harold L. Burstyn; Thomas R. Morrison

[57] ABSTRACT

A manufacturing method of a thin film transistor, wherein a laminated body consisting of an intrinsic amorphous silicon layer and a conductive amorphous silicon layer is formed on a glass substrate, and annealed at low temperatures not higher than 600° C. thereby obtaining a polycrystalline silicon film. The conductive amorphous silicon layer gives girth to a core for polycrystallization, and therefore the intrinsic amorphous silicon layer is easily recrystallized by annealing at low temperatures.

2 Claims, 8 Drawing Sheets

MANUFACTURING METHOD OF THIN FILM TRANSISTOR

BACKGROUND OF THE INVENTION

1. Field of the Invention

This invention relates to a manufacturing method of thin film transistors used in a liquid crystal display, a line sensor or the like.

2. Description of Related Art

Vigorous research and development has been made for semiconductor devices using polycrystalline silicon since polycrystalline silicon represents the largest carrier mobility among various kinds of thin film semiconductors. A representative semiconductor device of the type referred to above is a thin film transistor (referred to as a TFT hereinafter) used as a switching element for picture cell of a liquid crystal display, a driving circuit for a line sensor, etc. A variety of manufacturing methods of the TFTs have been proposed until now (IEEE ELECTRON DEVICE LETTERS. VOL. 9, NO. 6, JUNE 1988 pp290-292, etc.).

A conventional manufacturing method of TFTs using polycrystalline silicon will be discussed hereinbelow with reference to FIG. 1. A polycrystalline silicon film 32 is formed directly on an insulative substrate 31 made of silica by the low-pressure chemical vapor deposition (LPCVD) method (FIG. 1(a)). The temperature of the substrate at this time is not lower than 620° C. A silicon oxide film or silicon nitride film is formed as a gate insulative film 33 over the polycrystalline silicon film 32 and substrate 31, onto which a gate electrode 34 is patterned (FIG. 1(b)). Phosphorous is implanted from a direction of an arrow by ion implantation method so as to form a conductive polycrystalline silicon film for obtaining ohmic contact between a drain electrode and a source electrode which will be formed later and the polycrystalline silicon film 32. The implanted phosphorous is activated by annealing at 1000° C. or more. As a result, the polycrystalline silicon film 32 not covered with the gate electrode 34 is changed to an n-type polycrystalline silicon film 35 (FIG. 1(c)). The gate insulative film 33 in the region corresponding to the drain electrode and source electrode is removed by etching, thereby forming contact holes 36 (FIG. 1(d)). After the drain electrode 37 and source electrode 38 are formed, the TFT is completed (FIG. 1(e)).

The above-described manufacturing method utilizes a direct forming method wherein a polycrystalline silicon film is formed directly by the LPCVD method. Different from the direct forming method, a recrystallization method is also well known, wherein an amorphous silicon film is formed by plasma enhanced chemical vapor deposition (PCVD) method and is annealed by heat or laser beams thereby enabling recrystallization. However, the aforementioned methods for forming the polycrystalline silicon film have the following drawbacks.

Since a high temperature not lower than 600° C. is required in the direct forming method, a substrate to be used should have favorable heat resistance as silica or the like, causing an increase of manufacturing costs. The recrystallization method with heat (solid phase crystallization method) has a similar problem as outlined above. On the other hand, according to the recrystallization method with laser beams (laser recrystallization method), although an expensive substrate is not necessary, it is generally difficult to make the quality of the film, e.g., hydrogen content in the original amorphous silicon film optimal, and moreover, good reproducibility cannot be expected because of the insufficient stability of outputs of laser beams at present.

Further, in the conventional manufacturing method of TFTs described above, the conductive polycrystalline silicon film for ohmic contact should be formed at a high temperature not lower than 1000° C., requiring a costly heat-proof substrate such as a silica substrate. Further, the ion implantation method necessitates an accelerating mechanism to implant a dopant, making it difficult to enlarge the area of the substrate.

In the meantime, another kind of TFT is present which has a semiconductive thin film at a channel part made of non-crystalline silicon and a semiconductive thin film in contact with source and drain electrodes made of polycrystalline silicon. The non-crystalline silicon referred to here is a general term of amorphous silicon and microcrystalline silicon. In order to manufacture the TFT in the aforementioned structure, the amorphous silicon film is generally formed by the plasma gas decomposition method, CVD method, sputtering method, electron cyclotron resonance (ECR) method or the like. The temperature of the substrate is set to be not higher than 500° C. in any of the above methods. On the other hand, in forming the polycrystalline silicon film, the direct forming method, solid phase crystallization method, or laser recrystallization method, etc. as described earlier is used. The polycrystalline silicon film should be annealed at a temperature higher than the forming temperature of the amorphous silicon film in the direct forming method and solid phase recrystallization method, and therefore it is impossible to form both the amorphous silicon film and polycrystalline silicon film on the same substrate. In contrast, although both films may be formed on the same substrate according to the laser-recrystallization method, since the annealing process is conducted locally by laser beams, the stability of laser outputs is low, resulting in poor reproducibility.

Meanwhile, Japanese Patent Application Laid-Open No. 63-185015 (185015/1988) discloses a different method to form a polycrystalline silicon film on the substrate. According to the method disclosed therein, after an amorphous silicon film is formed on an insulative substrate, a dopant is implanted into the surface area of the amorphous silicon film and thermally treated. Thereafter, the layer where the dopant is included is removed. This method also requires implantation of the dopant, thus making it difficult to increase the area of the substrate.

SUMMARY OF THE INVENTION

In a manufacturing method of a TFT embodied by this invention, in one aspect, a conductive amorphous silicon layer and an intrinsic amorphous silicon layer are laminated on a substrate and the laminated body is annealed at a low temperature, i.e., 600° C. or lower, thereby forming a polycrystalline silicon film. At this time, since a core for polycrystallization is brought about in the conductive amorphous silicon layer, the intrinsic amorphous silicon layer is easily recrystallized by annealing at the low temperature. A dopant in the conductive amorphous silicon layer is dispersed into the intrinsic amorphous silicon layer to display conductivity. A part with conductivity is used as a conductive polycrystalline silicon film for ohmic contact. The conductive amorphous silicon layers at a part where it is desired to erase influences of the dispersed dopant, may be removed by etching after annealing.

In a manufacturing method of a TFT according to this invention, in a further aspect, a conductive amorphous silicon layer and an intrinsic amorphous silicon layer are laminated partly on a substrate and, an intrinsic amorphous silicon layer alone is formed on the remaining part of the substrate, which is then annealed. Accordingly, a polycrystalline silicon film is formed where both layers are laminated, while a non-crystalline silicon layer (amorphous silicon as it is or micro-crystalline silicon) is obtained where the intrinsic amorphous silicon layer alone is formed. According to the present manufacturing method, a TFT in which both the polycrystalline silicon film and non-crystalline silicon film are present can be manufactured.

In a manufacturing method of a TFT according to this invention, in a still further aspect, a p-type conductive amorphous silicon layer and an intrinsic amorphous silicon layer are laminated partly on a substrate, and an n-type conductive amorphous silicon layer and an intrinsic amorphous silicon layer are laminated on the remaining part of the substrate, which is then annealed, thereby obtaining polycrystalline silicon films of different types of conductivity at one time. According to this method, a TFT equipped with polycrystalline silicon films of different types of conductivity between an ohmic contact part and a channel part can be manufactured.

OBJECTS OF THE INVENTION

An object of this invention is to provide a manufacturing method of a TFT whereby a TFT with a polycrystalline silicon film can be manufactured at low temperatures.

A further object of this invention is to provide a manufacturing method of a TFT whereby a polycrystalline silicon film can be formed at low temperatures, thereby enabling employment of a cheap glass substrate.

A still further object of this invention is to provide a manufacturing method of a TFT whereby a part of a polycrystalline silicon film in the region to be a channel part is etched after being annealed, thereby preventing adverse influences of the dispersion of a dopant from a conductive amorphous silicon layer to an intrinsic amorphous silicon layer during annealing.

A yet further object of this invention is to provide a manufacturing method of a TFT whereby a polycrystalline silicon film and an amorphous silicon film can be formed at low temperatures simultaneously, thereby achieving easy manufacture of the TFT having both films formed on the same substrate.

A still further object of this invention is to provide a manufacturing method of a TFT whereby a polycrystalline silicon film having parts of different types of conductivity can be formed at low temperatures, thereby accomplishing easy manufacture of the TFT with such polycrystalline silicon film as above.

A different object of this invention is to provide a manufacturing method of a TFT whereby a polycrystalline silicon film of a large area can be formed without implantation of a dopant.

The above and further objects and features of the invention will more fully be apparent from the following detailed description with accompanying drawings.

DETAILED DESCRIPTION OF THE PREFERRED EMBODIMENTS

Preferred embodiments of this invention will be discussed in a detailed manner hereinbelow with reference to the accompanying drawings.

First a method of forming a polycrystalline silicon film, which is a fundamental concept of a manufacturing method of a TFT according to this invention will be explained with reference to FIG. 2. An insulating glass substrate 1 is prepared (FIG. 2(a)). An intrinsic amorphous silicon layer 2 without doping is formed approximately 1 $\mu$m thick on the glass substrate 1 by the plasma CVD method or sputtering method (FIG. 2(b)). For the plasma CVD method, the substrate temperature is set about 500° C. and SiH$_4$ is used for the material gas. Then an n-type conductive amorphous silicon layer 3 is formed approximately 0.2 $\mu$m thick on the intrinsic amorphous silicon layer 2 by the plasma CVD method or sputtering method (FIG. 2(c)). In the case of the plasma CVD method, the temperature of the substrate is about 200° C., the material gas is SiH$_4$ and PH$_3$, and the concentration of phosphorous is $2 \times 10^{19}$cm$^{-3}$. The whole body is annealed in the ambience of N$_2$ for up to 10 hours at 350°-570° C., whereby a polycrystalline silicon film 4 is obtained (FIG. 2(d)). The conductive amorphous silicon layer 3 generates a core for polycrystallization; therefore, the intrinsic amorphous silicon layer 2 can be easily recrystallized by annealing at low temperatures.

Figure 1A:
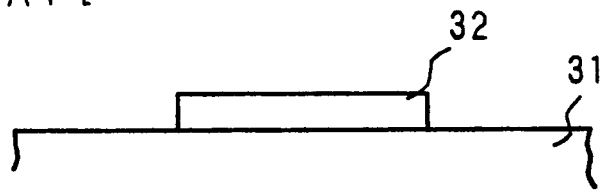
FIGS. 1(a)-1(e) are cross sectional views showing a conventional method of manufacturing a TFT.
Figure 1B:
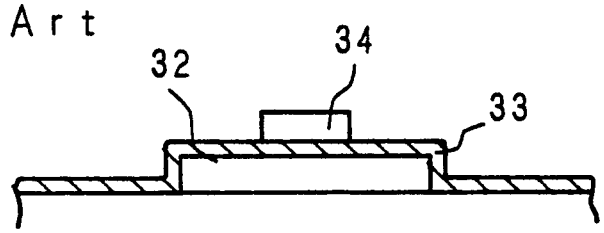
Figure 1C:
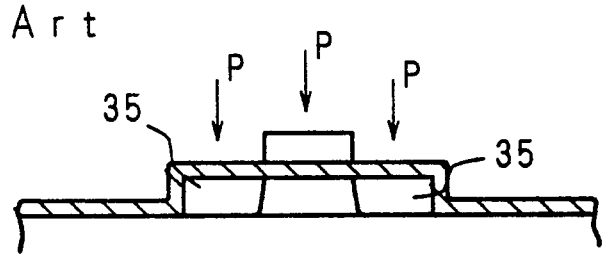
Figure 1D:
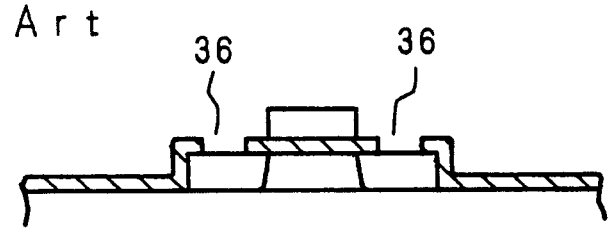
Figure 1E:
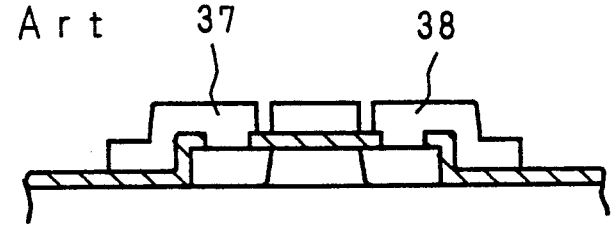
Figure 2A:
FIGS. 2(a)-2(d) are cross sectional views showing the process of forming a polycrystalline silicon film to be used in a method of manufacturing a TFT according to this invention.
Figure 2B:
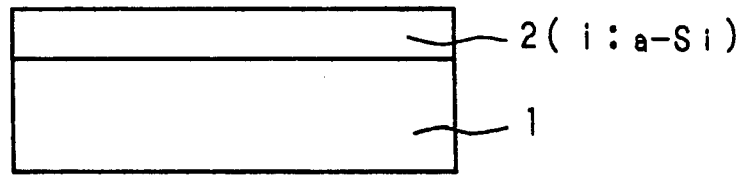
Figure 2C:
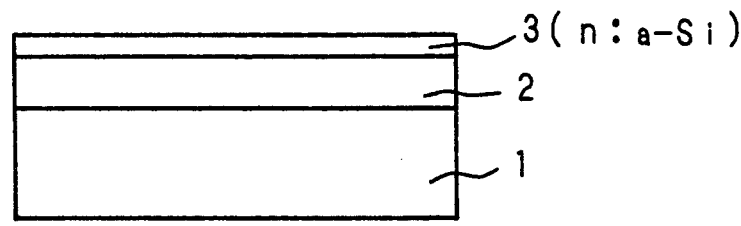
Figure 2D:
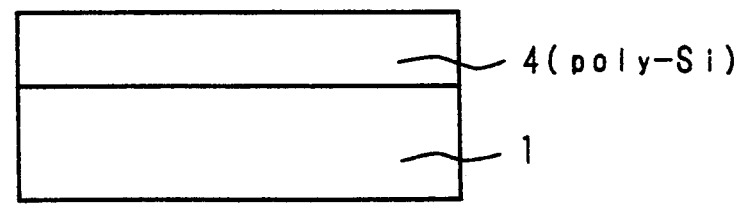
Figure 3:
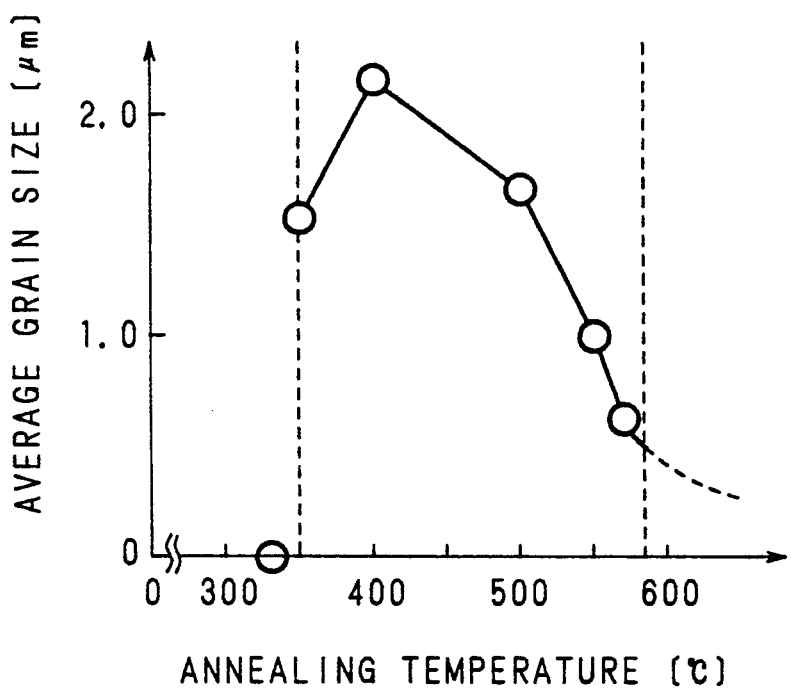
FIG. 3 is a graph showing the relation between the annealing temperature and the average grain size of silicon when the polycrystalline silicon film is formed.

The annealing temperature when the polycrystalline silicon film 4 is formed will be explained below. FIG. 3 is a graph of the relation between the annealing temperature and average grain size of silicon of the polycrystalline silicon film 4 in the process of FIG. 2. The annealing time is 9 hours. As is clear from FIG. 3, crystallization is not brought about at a temperature lower than 350° C., whereas the grain size of about 2 $\mu$m is observed at 400°-500° C. When the annealing temperature exceeds 570° C., the grain size is remarkably reduced. Accordingly, the annealing temperature is preferably 350°-570° C., particularly, 400°-500° C. The above temperature range is not inconvenient at all even when a glass substrate is used.

Referring to FIG. 4, a first embodiment of this invention will be discussed now. An intrinsic amorphous silicon layer 2 and an n-type conductive amorphous silicon layer 3 are sequentially laminated on an insulative glass substrate 1 in this order (FIG. 4(a)). The intrinsic amorphous silicon layer 2 is formed under the following condition;

forming method: plasma CVD method
    Temperature of substrate: 350°–500° C.
    Material gas: SiH$_4$ gas
    Film thickness: about 1.5 μm The conductive amorphous silicon layer 3 is formed under the following conditions;

Forming method: plasma CVD method
    Temperature of substrate: 300°–400° C.
    Material gas; SiH$_4$ gas + PH$_3$ gas
    Film thickness: about 500 Å
    Concentration of phosphorous: $2 \times 10^{19}$ cm$^{-3}$ Second, a semiconductive thin film 5 which is a laminated body of the layers 2 and 3 is annealed for 5 hours at 500° C. Then the semiconductive thin film 5 is crystallized to a polycrystalline silicon film 4 (FIG. 4(b)). At this time, phosphorous, which is an element to determine the type of conductivity of the conductive amorphous silicon layer 3, disperses to the intrinsic amorphous silicon layer 2, so that an n-type polycrystalline silicon film 4a is formed in the upper part of the polycrystalline silicon film 4.

Figure 4A:
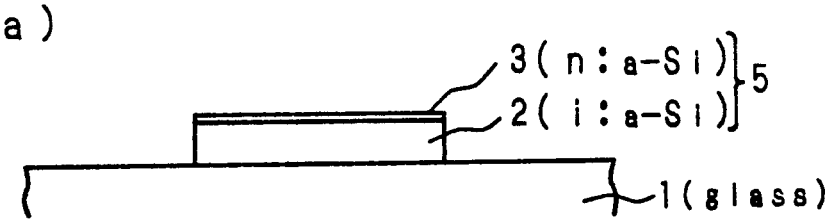
FIGS. 4(a)-4(e) are cross sectional views showing the process of manufacturing a TFT according to a first embodiment of this invention.
Figure 4B:
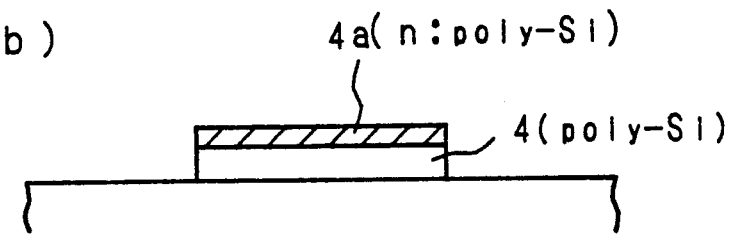
Figure 4C:
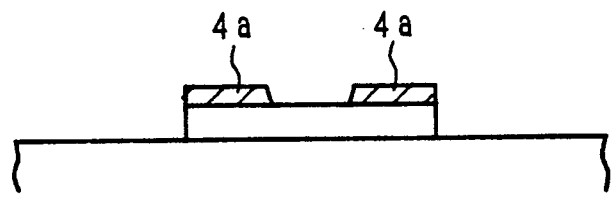
Figure 4D:
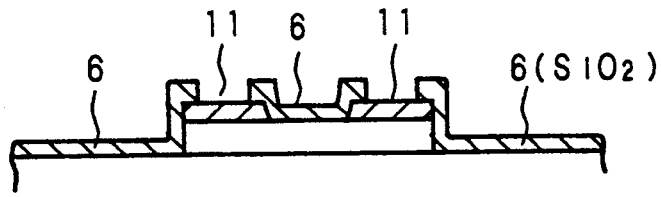
Figure 4E:
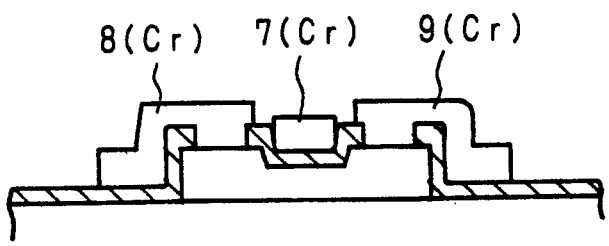

The polycrystalline silicon film 4 in the area to be a channel part of the TFT is removed by etching about 1 μm from the surface thereof (FIG. 4(c)). The etching is intended to remove a part of the surface where the phosphorous is highly concentrated, and, owing to this etching, the n-type polycrystalline silicon film 4a remains only at an ohmic contact part in touch with a drain electrode and a source electrode of the TFT.

An insulative film 6 is formed on the polycrystalline silicon film 4 and glass substrate 1 for a gate and passivation purpose by the plasma CVD method, atmospheric pressure CVD method or the like. The insulative film 6 is made of, for example, silicon oxide or silicon nitride. Then, the insulative film 6 in the region to be an ohmic contact part is removed by etching to form contact holes 11 (FIG. 4(d)). Finally, a metallic film of chromium, aluminum, titanium, molybdenum, etc. is vapor deposited on the insulative film 6 in the region to be the channel part and the exposed n-type polycrystalline silicon film 4a, whereby a gate electrode 7, a drain electrode 8 and a source electrode 9 are formed respectively (FIG. 4(e)).

Figure 5:
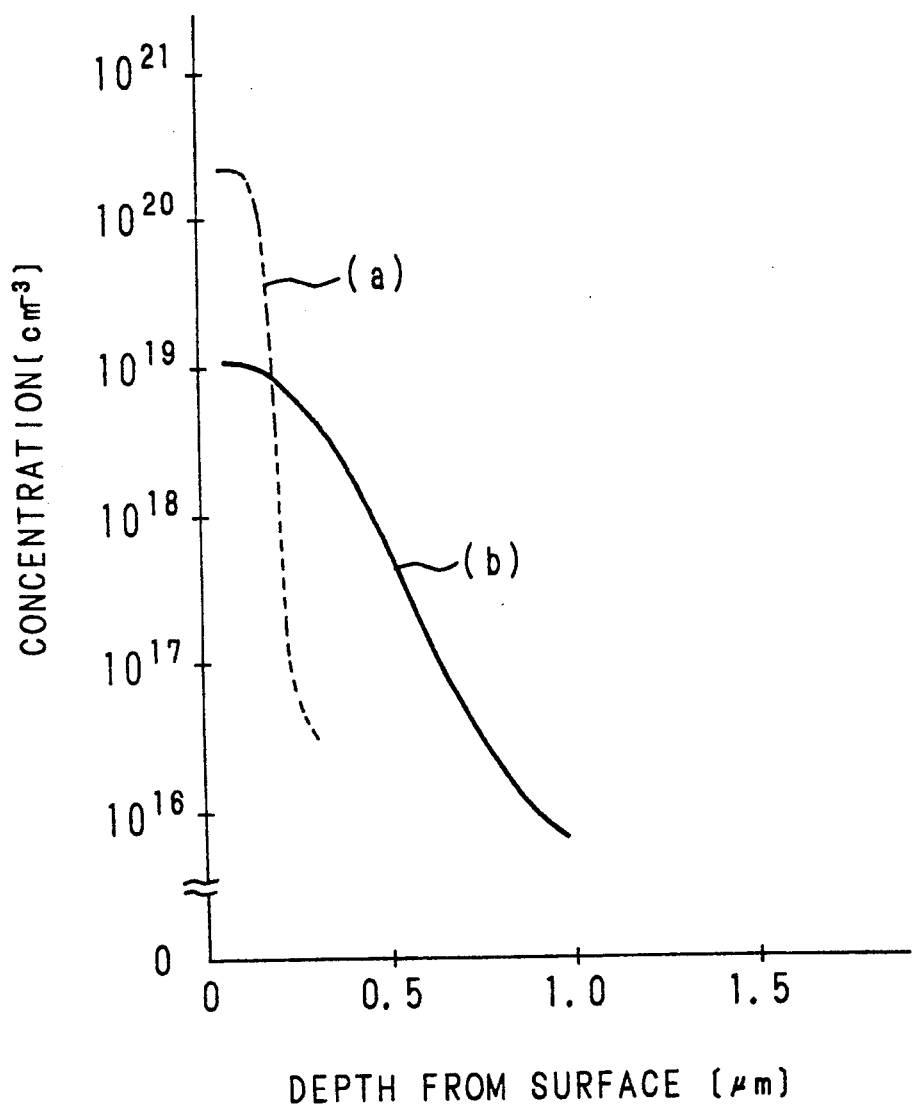
FIG. 5 is a graph of the relation between the etching depth and concentration of a dopant in the first embodiment.
Figure 6A:
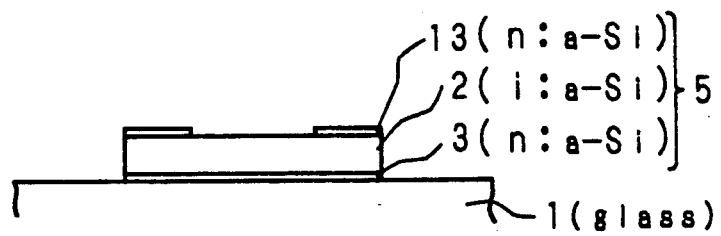
FIGS. 6(a)-6(d) are cross sectional views showing the process of manufacturing a TFT according to a second embodiment of this invention.
Figure 6B:
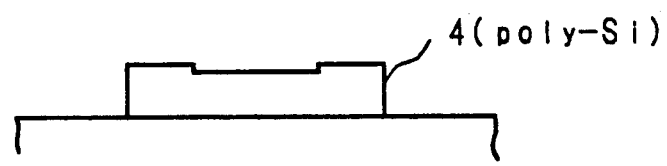
Figure 6C:
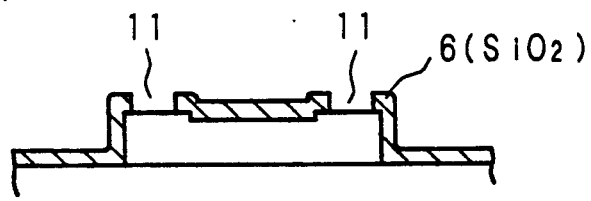
Figure 6D:
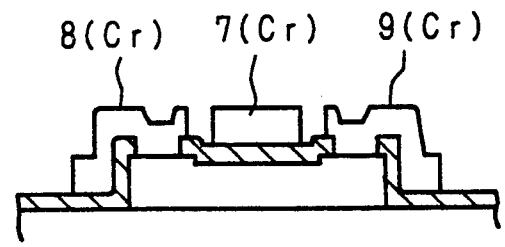

It is particularly important to control the depth of etching in the manufacturing process shown in FIG. 4(c). FIG. 5 is a graph indicating the relation between the etching depth from the surface of the semiconductive thin film 5 (or the polycrystalline silicon film 4) and concentration of phosphorous before and after annealing, with a broken line (a) showing the relation before annealing and a solid line (b) representing the relation after annealing. A secondary ion mass analysis method is used in this case. Before annealing, phosphorous is detected only in the range of about 500 Å corresponding to the thickness of the conductive amorphous silicon layer 3. Further, after annealing, the concentration of phosphorous is not smaller than $1 \times 10^{16}$ cm$^{-3}$ up to the depth of 1 μm. Therefore, etching is performed in the instant embodiment to the depth of 1 μm from the surface of the polycrystalline silicon thin film 4.

Although the part of the polycrystalline silicon film 4 showing the concentration of phosphorous of $1 \times 10^{16}$ cm$^{-3}$ or more is removed by etching according to the instant embodiment, this invention is not restricted to this, but the etching depth may be controlled in accordance with the required characteristic of the manufacturing TFT, while taking the annealing condition into consideration.

Moreover, although the conductive amorphous silicon layer 3 is n-type and phosphorous is used as a dopant in the instant embodiment, boron is employed as a dopant if the conductive amorphous silicon layer 3 is p-type.

In addition, although the foregoing description of the present embodiment is directed to the TFT of a coplanar type, the same holds true also for TFTs of a stagger type, reverse-stagger type and reverse-coplanar type.

In the first embodiment, since the annealing is performed at low temperature, a glass substrate of low cost can be employed. The n-type polycrystalline silicon film 4a having high concentration of phosphorous is formed only at the ohmic contact part, and, favorable ohmic property in the drain electrode 8 and source electrode 9 can be attained in the polycrystalline silicon film 4. Moreover, since the ion implantation method is not employed, a large area TFT can be manufactured.

A second embodiment of this invention will be depicted with reference to FIG. 6. An n-type conductive amorphous silicon layer 3, an intrinsic amorphous silicon layer 2 and an n-type conductive amorphous silicon layer 13 are laminated in this order on an insulative glass substrate 1. Then, the conductive amorphous silicon layer 13 in the area to be a channel part of the TFT is removed by etching (FIG. 6(a)). The conductive amorphous silicon layer 3 has the film thickness of about 100 Å and concentration of phosphorous of $5 \times 10^{17}$ cm$^{-3}$. The intrinsic amorphous silicon layer 2 has the film thickness of about 1000–3000 Å, and the conductive amorphous silicon layer 13 has the film thickness of 300 Å and concentration of phosphorous of $1 \times 10^{19} - 1 \times 10^{20}$ cm$^{-3}$. The conductive amorphous silicon layer 3 (at the side of the substrate 1) brings about a core for polycrystallization, but it has a relatively low concentration of phosphorous, so the dispersion of phosphorous to the channel part is eliminated. On the contrary, the conductive amorphous silicon layer 13 has a relatively high concentration of phosphorous since it works as an ohmic contact part.

A semiconductive thin film 5 which is a laminated body of the intrinsic amorphous silicon layer 2, conductive amorphous silicon layers 3, 13 is annealed for up to 10 hours at 350°–500° C. As a result, the semiconductive thin film 5 grows to a polycrystalline silicon film 4 (FIG. 6(b)). The upper surface of the polycrystalline silicon film 4 is n-type at both ends thereof, and i-type at the central part thereof.

Thereafter, an insulative film 6 of silicon oxide aimed for a gate and passivation purpose is formed on the polycrystalline silicon film 4 and substrate 1 by a plasma CVD method, atmospheric pressure CVD method, etc. The insulative film 6 in the region to be the ohmic contact part is removed by etching, thereby forming contact holes 11 (FIG. 6(c)). Then, a metallic film of chromium, aluminum, titanium, molybdenum, etc. is vapor deposited both on the insulative film 6 in the region to be the channel part and on the exposed n-type polycrystalline silicon film 4, whereby a gate electrode 7, a drain electrode 8 and a source electrode 9 are formed (FIG. 6(d)).

A third embodiment of this invention will be discussed with reference to FIG. 7. According to the third embodiment, a TFT is manufactured with a semiconductive thin film at a channel part made of amorphous silicon, while a semiconductive thin film in contact with a drain and a source electrode is made of polycrystalline silicon.

Figure 7A:
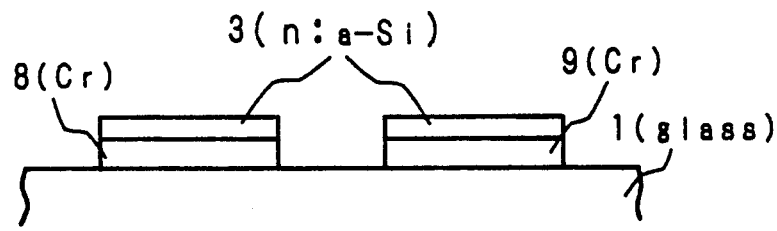
FIGS. 7(a)-7(d) are cross sectional views showing the process of a manufacturing method of a TFT according to a third embodiment of this invention.
Figure 7B:
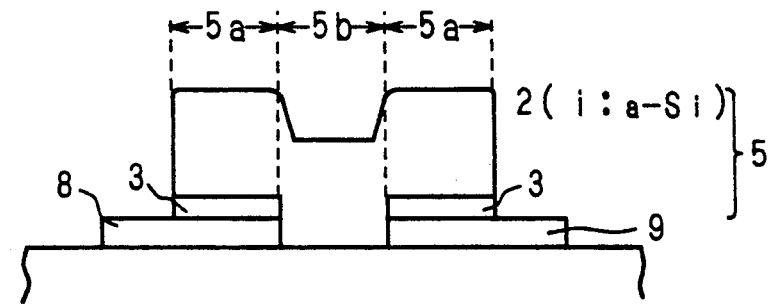
Figure 7C:
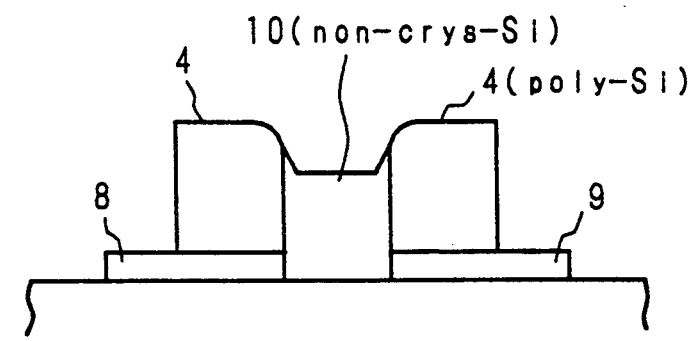

After a metallic film of chromium, molybdenum, tantalum, titanium, etc., and an n-type conductive amorphous silicon layer are sequentially laminated on an insulative glass substrate 1, patterning is performed to remove the central part, whereby a drain electrode 8, a source electrode 9 and a conductive amorphous silicon layer 3 overlapped onto the electrodes 8, 9 are formed (FIG. 7(a)). The conductive amorphous silicon layer 3 is formed under the following conditions;

Forming method: plasma CVD method
Temperature of substrate: 200°–400° C.
Material gas: SiH$_4$ gas + PH$_3$ gas
Film thickness: about 300 Å
Concentration of phosphorous: $1 \times 10^{19} - 1 \times 10^{20}$ cm$^{-3}$ The conductive amorphous silicon layer 3 is formed only in the area corresponding to the drain and source electrodes. The reason for this is to change the amorphous silicon into polycrystalline only in the area corresponding to the drain and source electrodes.

An intrinsic amorphous silicon layer 2 is formed all over the conductive amorphous silicon layer 3 and the substrate 1. Subsequently, patterning is performed to remove the intrinsic amorphous silicon layer 2 and conductive amorphous silicon layer 3 at the side edge of each electrode 8, 9 (FIG. 7(b)). Accordingly, a semiconductive thin film 5 is formed as a laminated body having a central part 5b formed of the intrinsic amorphous silicon layer 2 and side edges 5a formed of the conductive amorphous silicon layer 3 and intrinsic amorphous silicon layer 2. It is desirable to etch the surface of the conductive amorphous silicon layer 3 slightly before the intrinsic amorphous silicon layer 2 is layered thereon in order to remove a natural oxide film generated during the process. The forming condition of the intrinsic amorphous silicon layer 2 is depicted below;

Forming method: plasma CVD method
Temperature of substrate: 200°–400° C.
Material gas: SiH$_4$ gas
Film thickness: about 2000–3000Å

Then, the semiconductive thin film 5 is annealed for approximately 10 hours at 500°–570° C. (FIG. 7(c)). If the semiconductive thin film 5 is annealed at a temperature higher than the above, the whole of the intrinsic amorphous silicon layer 2 is polycrystallized. In this connection, however, it is possible to return the intrinsic amorphous silicon to polycrystalline silicon, or to micro-crystalline silicon by adjusting the annealing time. If the semiconductive thin film 5 is annealed at a temperature lower than the above, the side edge 5a is changed to a polycrystalline silicon film 4 and the central part 5b becomes a non-crystalline silicon film 10 made of intrinsic amorphous silicon or micro-crystalline silicon. Although polycrystallization takes place, not only in a depthwise direction of the film, but in a direction of the film surface, namely, a transverse direction, the growing length in the transverse direction is about the film thickness of the semiconductive thin film 5, hardly influencing the length of the channel of the manufacturing TFT.

Figure 7D:
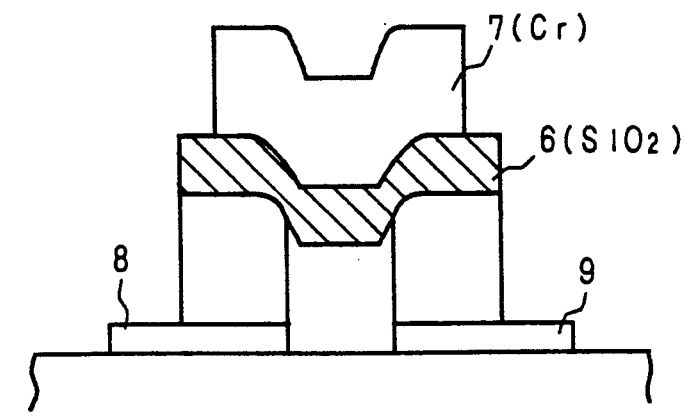

After an insulative film made of silicon oxide, silicon nitride, tantalum oxide or the like is formed by plasma CVD method, thermal CVD method, etc., a metallic film made of chromium, tantalum, molybdenum, aluminum or the like is vapor deposited, and an insulative film 6 for a gate and a gate electrode 7 are patterned (FIG. 7(d)).

According to the instant third embodiment, the polycrystalline silicon film and amorphous silicon film are both present in one TFT. If such a semiconductor device is to be manufactured so that many TFTs are mixedly laminated on the same single substrate, TFTs having the semiconductive thin films made of polycrystalline silicon only and TFTs having the semiconductive thin films made of amorphous silicon only, the third embodiment is applicable. In the above case, the semiconductive thin film in the region where the TFTs consist of polycrystalline silicon films only are formed of a laminated body of a conductive amorphous silicon layer and an intrinsic amorphous silicon layer, and the semiconductive thin film in the region where the TFTs consist of amorphous silicon films only are formed of an intrinsic amorphous silicon layer.

A fourth embodiment will now be explained with reference to FIG. 8, whereby a TFT having a polycrystalline silicon film where an ohmic contact part and a channel part are reversed in conductivity is manufactured.

Figure 8A:
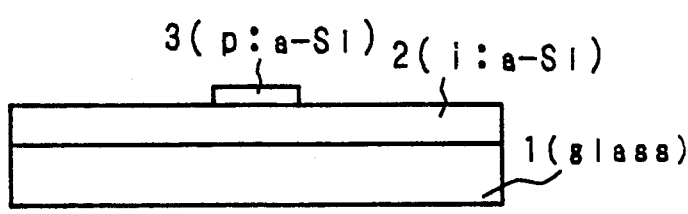
FIGS. 8(a)-8(f) are cross sectional views showing the process of manufacturing of a TFT according to a fourth embodiment of this invention.

On an insulative glass substrate 1, an intrinsic amorphous silicon layer 2 and a p-type conductive amorphous silicon layer 3 are laminated in this order sequentially, and, the conductive amorphous silicon layer 3 is subjected to patterning leaving only the central part thereof (FIG. 8(a)). The forming condition of the intrinsic amorphous silicon layer 2 is:

Forming method: plasma CVD method
Material gas: SiH$_4$ gas
Film thickness: about 5000 Å

The forming condition of the conductive amorphous silicon layer 3 is:

Forming method: plasma CVD method
Material gas: SiH$_4$ gas + B$_2$H$_6$ gas
Film thickness: about 1000 Å
Concentration of boron: $1 \times 10^{16} \sim 1 \times 10^{18}$ cm$^{-3}$ When the doping concentration of boron is smaller than $1 \times 1^{16}$ cm$^{-3}$, polycrystallization is not brought about (after annealing for 10 hours at 500° C.), whereas, when the doping concentration is over $1 \times 10^{18}$ cm$^{-3}$, the property of the manufacturing TFT is worsened.

Figure 8B:
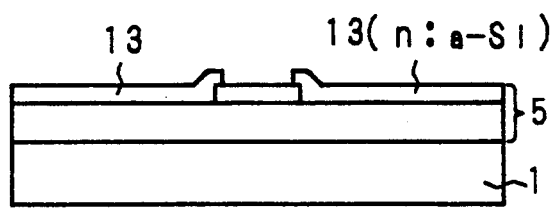

An n-type conductive amorphous silicon layer 13 is formed all over the intrinsic amorphous silicon layer 2 except on the upper surface of the conductive amorphous silicon layer 3 (FIG. 8(b)). The forming condition of the conductive amorphous silicon layer 13 is as follows:

Forming method: plasma CVD method
Material gas: SiH$_4$ gas + PH$_3$ gas
Film thickness: about 1000 Å
Concentration of phosphorous: $5 \times 10^{19} - 5 \times 10^{20}$ cm$^{-3}$ If the doping concentration of phosphorous is below $5 \times 10^{19}$ cm$^{-3}$, it becomes impossible to obtain the concentration $1 \times 10^{19}$ cm$^{-3}$ necessary for ohmic contact when phosphorous is dispersed. Plasma CVD method cannot realize the doping concentration of phosphorous exceeding $5 \times 10^{20}$ cm$^{-3}$ in the conductive amorphous silicon layer.

Figure 8C:
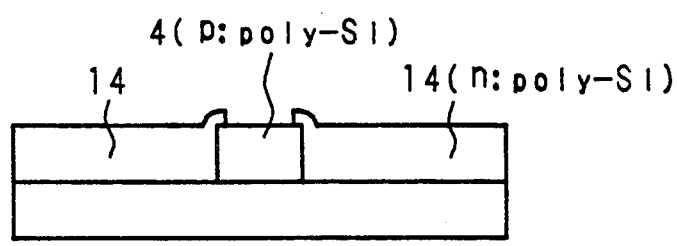
Figure 8D:
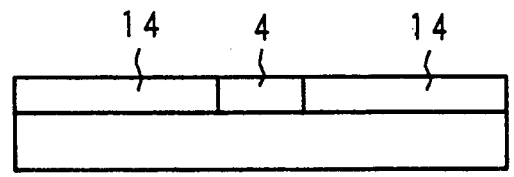
Figure 8E:
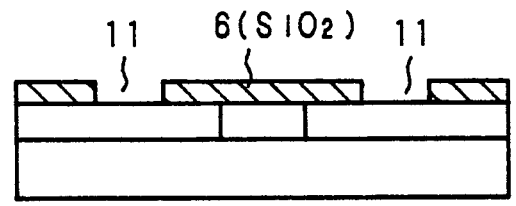
Figure 8F:
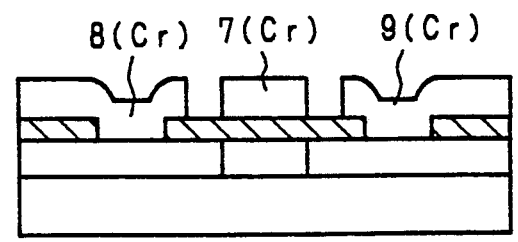

A semiconductive thin film 5 consisting of the intrinsic amorphous silicon layer 2 and conductive amorphous silicon layers 3, 13 is annealed at 500° C. for 10 hours (FIG. 8(c)). Consequently, the central part of the semi-conductive thin film 5 consisting of the intrinsic amorphous silicon layer 2 and p-type conductive amorphous silicon layer 3 becomes a p-type polycrystalline silicon film 4, and the side edge of the semiconductive thin film 5 consisting of the intrinsic amorphous silicon layer 2 and n-type conductive amorphous silicon layer 13 becomes an n-type polycrystalline silicon film 14. The surface of the polycrystalline silicon films 4, and 14 are slightly etched flat to facilitate patterning in the post-treatment (FIG. 8(d)).

Then an insulative film 6 of silicon oxide is formed 1000Å thick by plasma CVD method, atmospheric pressure CVD method, etc. The insulative film 6 in the region corresponding to the ohmic contact part is removed by etching, thereby forming contact holes 11 (FIG. 8(e)). When a metallic film of chromium or the like is vapor deposited and subjected to patterning, a gate electrode 7, a drain electrode 8 and a source electrode 9 are formed (FIG. 8(f)).

The p-type polycrystalline silicon film 4 is obtained with a large grain size. The n-type polycrystalline silicon film 14 has a small grain size since the doping amount is large in the n-type conductive amorphous silicon layer 13, but attaining favorable ohmic contact. The electron mobility of the manufacturing TFT is approximately 190 cm$^2$/V.s.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method of manufacturing a thin film transistor having a polycrystalline silicon film wherein an ohmic contact part and a channel part have conductivity opposite to each other, comprising:
   laminating, on a substrate in the region corresponding to the ohmic contact part, an intrinsic amorphous silicon layer and a first conductive amorphous silicon layer to form a first laminated body;
   laminating, on the substrate in the region corresponding to the channel part, an intrinsic amorphous silicon layer and a second conductive amorphous silicon layer to form a second laminated body;
   said second conductive amorphous silicon layer having a conductivity opposite to that of said first conductive amorphous silicon layer; and
   annealing said first and said second laminated body, thereby forming said polycrystalline silicon film.

2. A method of manufacturing a thin film transistor having a polycrystalline silicon film wherein an ohmic contact part and a channel part have conductivity opposite to each other, comprising:
   laminating, on a substrate in the region corresponding to the ohmic contact part, an intrinsic amorphous silicon layer and a first conductive amorphous silicon layer to form a first laminated body;
   laminating, on the substrate in the region corresponding to the channel part, an intrinsic amorphous silicon layer and a second conductive amorphous silicon layer to form a second laminated body;
   said second conductive amorphous silicon layer having a conductivity opposite to that of said first conductive amorphous silicon layer;
   annealing said first and said second laminated body, thereby obtaining a polycrystalline silicon film;
   forming an insulating film on said polycrystalline silicon film;
   forming a contact hole in said insulating film;
   forming a gate electrode over said channel part; and
   forming a drain electrode and a source electrode over said ohmic contact part.

* * * * *